(12) United States Patent
Kim et al.

(10) Patent No.: US 9,526,164 B2
(45) Date of Patent: Dec. 20, 2016

(54) PRINTED CIRCUIT BOARD AND MANUFACTURING METHOD THEREOF

(71) Applicant: Samsung Electro-Mechanics Co., Ltd., Suwon-si (KR)

(72) Inventors: Han Kim, Suwon-si (KR); Dae Hyun Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/002,028

(22) Filed: Jan. 20, 2016

(65) Prior Publication Data

US 2016/0302301 A1  Oct. 13, 2016

(30) Foreign Application Priority Data

Apr. 10, 2015 (KR) ........................ 10-2015-0050943

(51) Int. Cl.
  *H05K 1/02* (2006.01)
  *H05K 1/11* (2006.01)
  *H05K 3/00* (2006.01)

(52) U.S. Cl.
  CPC .......... *H05K 1/0216* (2013.01); *H05K 1/0298* (2013.01); *H05K 1/115* (2013.01); *H05K 3/0044* (2013.01); *H05K 3/0094* (2013.01); *H05K 2201/09063* (2013.01)

(58) Field of Classification Search
  CPC .... H05K 3/0052; H05K 3/005; H05K 3/0047; H01L 24/94; H01L 24/95; H01L 24/96
  See application file for complete search history.

(56) References Cited

U.S. PATENT DOCUMENTS

| | | | |
|---|---|---|---|
| 2006/0073675 A1* | 4/2006 | Yamamura | H01L 21/50 438/458 |
| 2008/0090044 A1* | 4/2008 | Imamura | H01L 21/4807 428/43 |
| 2013/0020685 A1 | 1/2013 | Kwak et al. | |
| 2014/0041907 A1 | 2/2014 | Kim et al. | |
| 2014/0160745 A1* | 6/2014 | Mandelboum | G02B 27/0938 362/235 |
| 2015/0061103 A1* | 3/2015 | Manack | H01L 23/5389 257/698 |

FOREIGN PATENT DOCUMENTS

| | | |
|---|---|---|
| JP | 2005-123432 A | 5/2005 |
| KR | 10-2013-0010359 A | 1/2013 |
| KR | 10-2014-0021910 A | 2/2014 |

\* cited by examiner

Primary Examiner — Hoa C Nguyen
Assistant Examiner — Amol Patel
(74) Attorney, Agent, or Firm — NSIP Law (57) ABSTRACT

A printed circuit board and a method of manufacturing a printed circuit board are provided. The printed circuit board includes a base, a wiring structure disposed on at least one of a surface and an interior of the base, and a plurality of stitching vias penetrating through the base in a thickness direction along an edge of the base and having side surfaces exposed externally.

18 Claims, 8 Drawing Sheets

PRINTED CIRCUIT BOARD AND MANUFACTURING METHOD THEREOF

CROSS-REFERENCE TO RELATED APPLICATION

This application claims the benefit under 35 USC 119(a) of Korean Patent Application No. 10-2015-0050943 filed on Apr. 10, 2015, in the Korean Intellectual Property Office, the entire disclosure of which is incorporated herein by reference for all purposes.

BACKGROUND

1. Field

The following description relates to a printed circuit board and a manufacturing method thereof.

2. Description of Related Art

With the recent miniaturization of electronic devices and an increase in the complexity of electronic element packages, the desirability of improving heat radiation properties, as well as the stability of printed circuit boards, has increased. For example, in a multi-chip package (MCP) in which a plurality of semiconductor chips are stacked and mounted on a single board, or in a package on package (POP) in which a plurality of boards mounted with a semiconductor chip are stacked, a large number of components are packed into a small space. Thus, it is desirable to further improve the heat radiation properties, stability, reliability and the like of printed circuit boards to produce reliable electronic element packages.

Further, electromagnetic waves are generated in printed circuit boards when signals and power are transferred within the boards. Thus, it is desirable to decrease noise due to electromagnetic waves, in addition to improving the heat radiation properties of printed circuit boards.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a base, a wiring structure disposed on at least one of a surface and an interior of the base, and a plurality of stitching vias penetrating through the base in a thickness direction along an edge of the base and having side surfaces exposed externally.

The plurality of stitching vias may be formed in alignment along at least one edge of the base.

The plurality of stitching vias may be formed in alignment along at least two edges of the base.

One stitching via among the plurality of stitching vias may be shared between a first set of stitching vias arranged along a first edge of the base and a second set of stitching vias arranged along a second edge of the base adjacent to the first edge.

The plurality of stitching vias may be formed in alignment along at least four edges of the base.

The plurality of stitching vias may be disposed to be shifted left and right along one edge of the base.

At least one of the plurality of stitching vias may be cut in the thickness direction of the base, and a cutting surface thereof may be co-planar with a side surface of the printed circuit board.

The plurality of stitching vias may be electrically connected to a ground terminal of the wiring structure.

The plurality of stitching vias may be not electrically connected to the wiring structure.

The general aspect of the printed circuit board may further include additional vias disposed around the plurality of stitching vias, side surfaces of the additional vias not being exposed externally.

At least two of the plurality of stitching vias may have different shapes from each other.

Regions of the wiring structure disposed on upper and lower surfaces of the base may form ground terminals, and a region of the wiring structure disposed in the interior of the base may form a power terminal.

The wiring structure may include a circuit pattern disposed on at least one of the surface and the interior of the base, and a conductive via connecting the circuit pattern.

The stitching vias may have a diameter larger than a diameter of the conductive via.

In another general aspect, a method of manufacturing a printed circuit board involves forming stitching vias to penetrate through a base in a thickness direction of the base, and cutting the base along the stitching vias to obtain a printed circuit board so that at least a portion of the stitching vias is exposed along a side surface of the printed circuit board.

The general aspect of the method may further involve forming a wiring structure in the base, the wiring structure being disposed on at least a surface or an interior of the base in the printed circuit board obtained by cutting along the stitching vias.

The forming of the stitching vias may involve forming a plurality of vias to penetrate through the base, and filling the plurality of vias with a metal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In the drawings, the shapes and dimensions of elements may be exaggerated for clarity, and the same reference numerals will be used throughout to designate the same or like elements.

Figure 1:
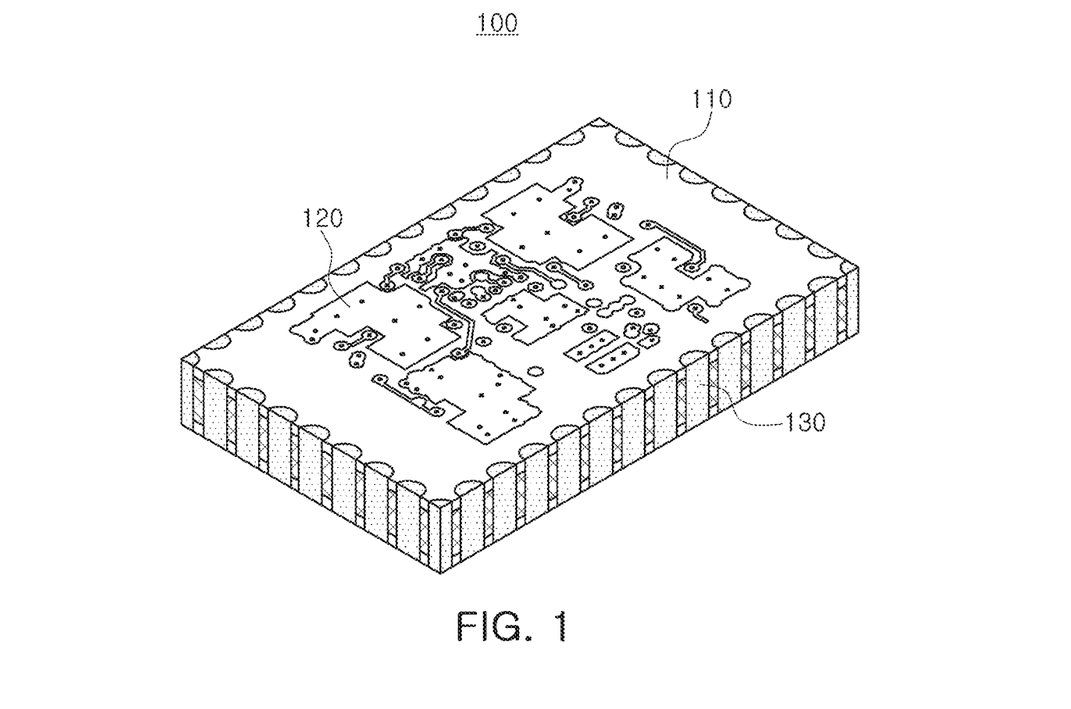
FIG. 1 is a perspective view illustrating an example of a printed circuit board according to the present description.

FIG. 1 illustrates an example of a printed circuit board according to the present description.

Referring to FIG. 1, a printed circuit board 100 includes a base 110, a wiring structure 120, and a plurality of stitching vias 130 disposed on an edge of the base 110.

In this example, the base 110 forms a core region of the printed circuit board 100 and is formed in a plate shape as illustrated in FIG. 1. However, a shape thereof is not limited to that illustrated in FIG. 1. The base 110 may be primarily formed of an insulating material. Examples of suitable insulating materials include a thermosetting resin such an epoxy resin, a thermoplastic resin such as polyimide, a thermosetting resin or a thermoplastic resin impregnated with a reinforcing material such as a glass fiber or an inorganic filler, and a prepreg. However, the insulating material is not limited thereto.

The wiring structure 120 may be formed on at least one of a surface of the base 110 and in an interior of the base 110. According to one example, the wiring structure 120 may be formed on both the surface and the interior of the base 110. The wiring structure 120 may include a circuit pattern formed on at least one of the surface and the interior of the base and a conductive via connecting the circuit patterns. The conductive via may be formed to penetrate through the base 110 in a thickness direction to connect circuit patterns formed on different levels to each other. Only a portion of the conductive via may be exposed to the surface of the base 110, as illustrated in FIG. 1. Regions of the wiring structure 120 formed on upper and lower surfaces of the base 110 may form ground terminals, and regions of the wiring structure 120 formed in the interior of the base 110 may form a power terminal. The ground terminals and the power terminals may be formed by adjusting a shape of the wiring structure 120, if necessary.

Meanwhile, the circuit pattern and the conductive via constituting the wiring structure 120 may be formed of a metal having excellent electrical conductivity such as copper, nickel, silver, or the like, by a method known in the art. For example, a plating method, a deposition method, or the like may be used to form the wiring structure 120. The shape of the wiring structure 120 illustrated in FIG. 1 is provided only as an example. In another example according to the present description, the shapes, positions, or the like, of the circuit pattern and the conductive via may be different.

In this example, the plurality of stitching vias 130 penetrating through the base 110 in the thickness direction and having side surfaces exposed externally are disposed on the edge of the base 110. Referring to FIG. 1, the stitching vias 130 may be formed in array form on one edge of the base 110. That is, the stitching vias 130 are disposed in an alignment along the edge of the base 110. Although an example in which the stitching vias 130 are formed on all four edges of the base 110 is illustrated in FIG. 1, the stitching vias 130 may only be formed on three or fewer edges of the base 110 in another example. In this example, in the event that the stitching vias 130 are disposed on at least two edges of the base 110 as illustrated in FIG. 1, one array arranged at one edge of the base 110 may share a stitching via with another array arranged on another edge of base 110 adjacent thereto.

The stitching vias 130 used in the present example are formed along the edge of the base 110, such that electromagnetic wave noise generated in the printed circuit board 100 may be effectively blocked. In addition, heat from the printed circuit board 100 may be effectively radiated by providing a heat radiation path. In this case, heat radiation properties may be significantly increased when the side surfaces of the stitching vias 130 are exposed externally of the printed circuit board 100. However, the side surfaces of the stitching vias 130 are not necessarily exposed externally. That is, according to another example, the side surfaces of the stitching vias 130 may not be exposed externally. In this case, the stitching vias 130 may also perform electromagnetic wave noise blocking performance. Further, although not illustrated in FIG. 1, the stitching vias 130 may be connected to a ground terminal of the wiring structure 120, so that electrical properties such as a Pi property and the like may be improved.

However, the stitching vias 130 and the wiring structure 120 are not connected to each other in all embodiments. According to another example, the stitching vias 130 may be designed so as not to be electrically connected to the wiring structure 120. In this case, the stitching vias 130 may also perform an electromagnetic wave blocking function, a heat radiation function, or the like. In consideration of various functions that may be performed by the stitching via 130 as described above, the stitching via 130 may be formed of a conductive material having excellent electrical conductivity and thermal conductivity. For example, the stitching via 130 may be formed of the same material (copper, or the like) as that of the conductive via of the wiring structure 120. Further, a size of the stitching via 130 may be determined in consideration of the functions thereof, process convenience, or the like, and in order to more effectively perform the electromagnetic wave blocking function, or the like. In one example, the stitching via 130 may be formed to have a diameter larger than that of the conductive via. Of course, in consideration of the process convenience, or the like, in another example, the stitching via 130 and the conductive via may be formed to have the same size as each other.

Figure 2A:
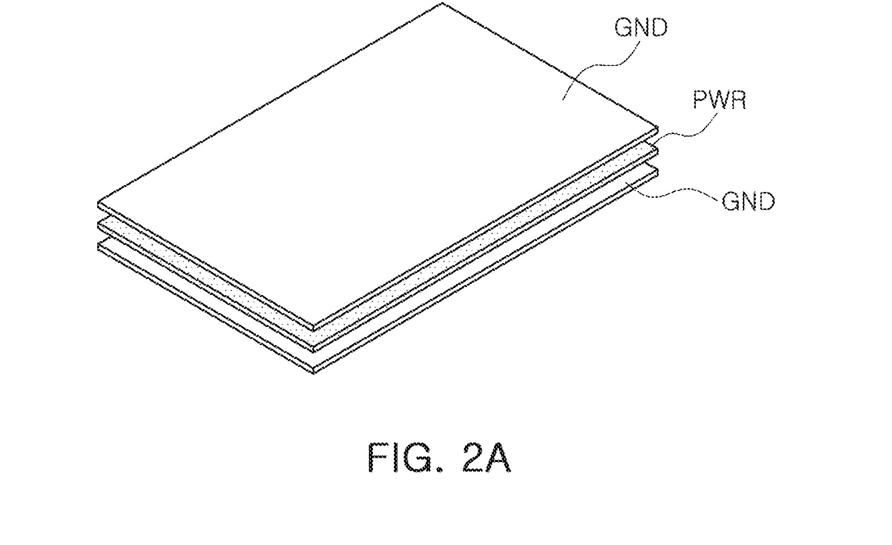
FIGS. 2A and 2B illustrate electromagnetic wave noise characteristics of a printed circuit board that does not include a stitching via.
Figure 2B:
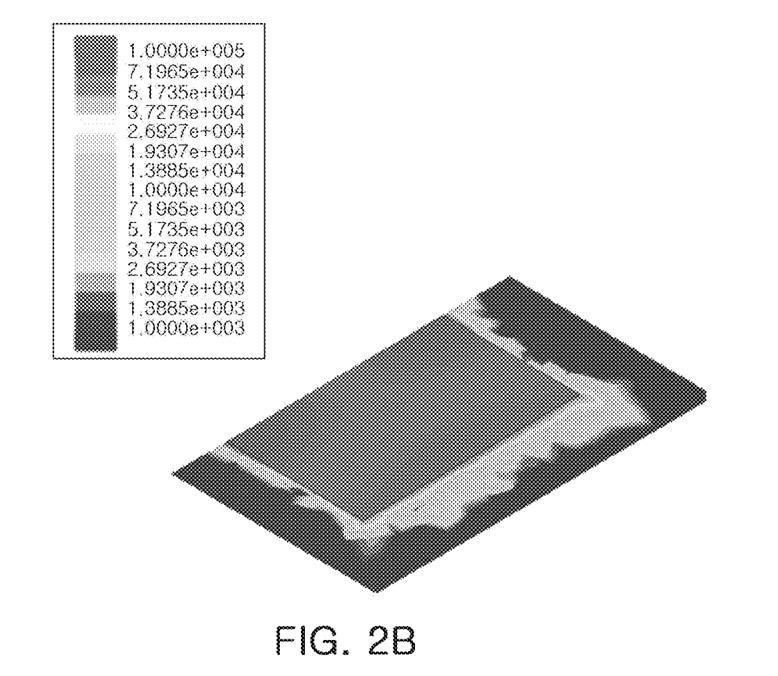

The functions of the stitching via 130 are described further with reference to FIGS. 2A through 4. First, FIGS. 2A and 2B illustrate electromagnetic wave noise characteristics of a printed circuit board that does not include stitching vias. Referring to FIG. 2A, ground terminals GND may be formed on upper and lower surfaces of the printed circuit board, and a power terminal PWR may be formed therebetween. As illustrated in an electromagnetic wave simulation result of FIG. 2B, in the printed circuit board without stitching vias, a large amount of electromagnetic waves are emitted through side surfaces of the printed circuit board.

Figure 3:
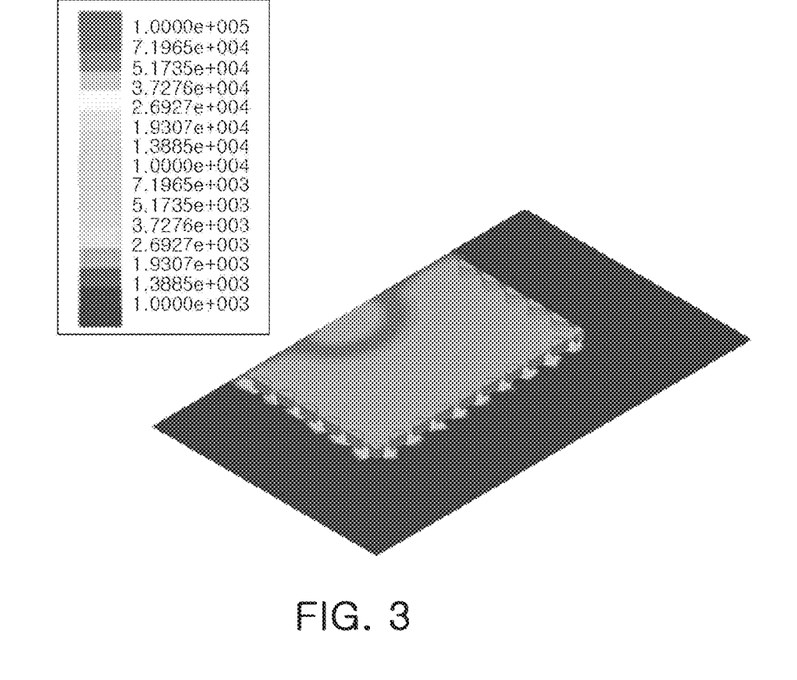
FIG. 3 illustrates results of a simulation of electromagnetic waves of an example of a printed circuit board using stitching vias according to the present description.

On the contrary, FIG. 3 illustrates results of a simulation of electromagnetic waves of a printed circuit board that includes stitching vias according to an example of the present description. As illustrated in FIG. 3, in comparison to a printed circuit board without stitching vias, electromagnetic wave noise was significantly decreased by the stitching vias in this example.

Figure 4:
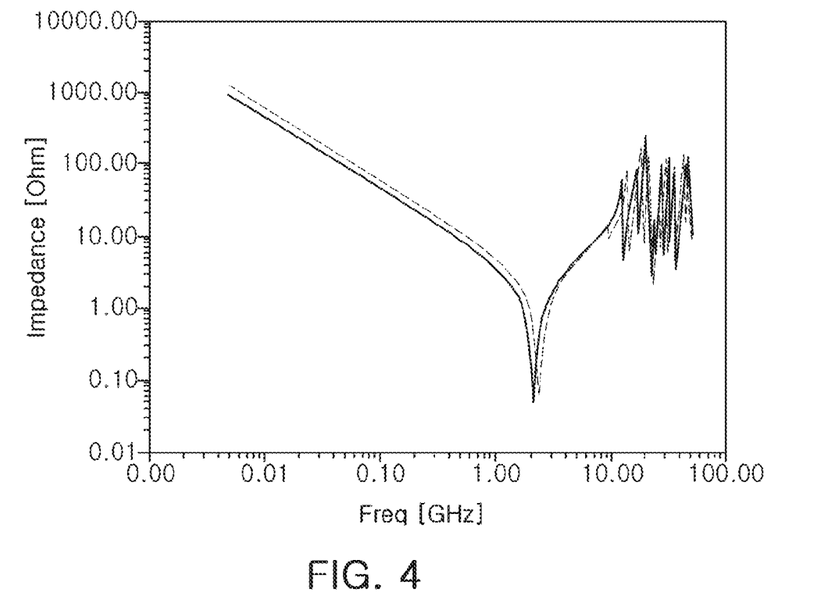
FIG. 4 is a graph comparing input impedance characteristics of an example of a printed circuit board according to the present description and a comparative example of a printed circuit board without stitching vias.

In addition, FIG. 4 illustrates the input impedance characteristics of an example of a printed circuit board with stitching vias according to the present description and a comparative example of a printed circuit board without stitching vias. The example of the printed circuit board with stitching vias is illustrated with a straight line, and the comparative example of a printed circuit board without stitching vias is illustrated with a dotted line. FIG. 4 confirms that the electrical properties of a printed circuit board differs based on whether the stitching vias are provided or not provided.

Referring to FIG. 4, in a printed circuit board with stitching vias, as illustrated by straight line, the input impedance of the printed circuit board was decreased in comparison to a printed circuit board without stitching vias. The reason may be that the stitching vias may be serving as a ground terminal as described above.

Hereinafter, an example of a manufacturing method of a printed circuit board capable of efficient product, and various modified examples thereof will be described.

Figure 5A:
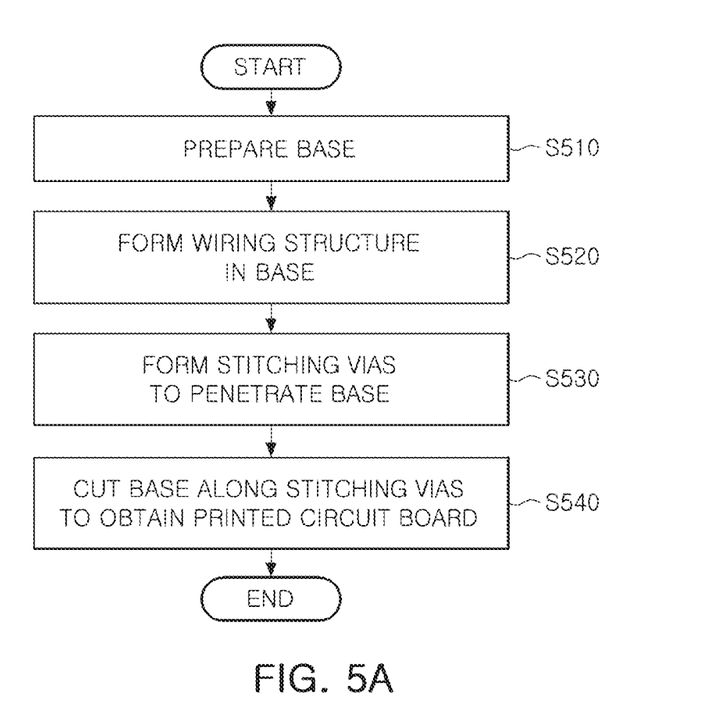
FIG. 5A is a flow chart illustrating an example of a method of manufacturing a printed circuit board.
Figure 5B:
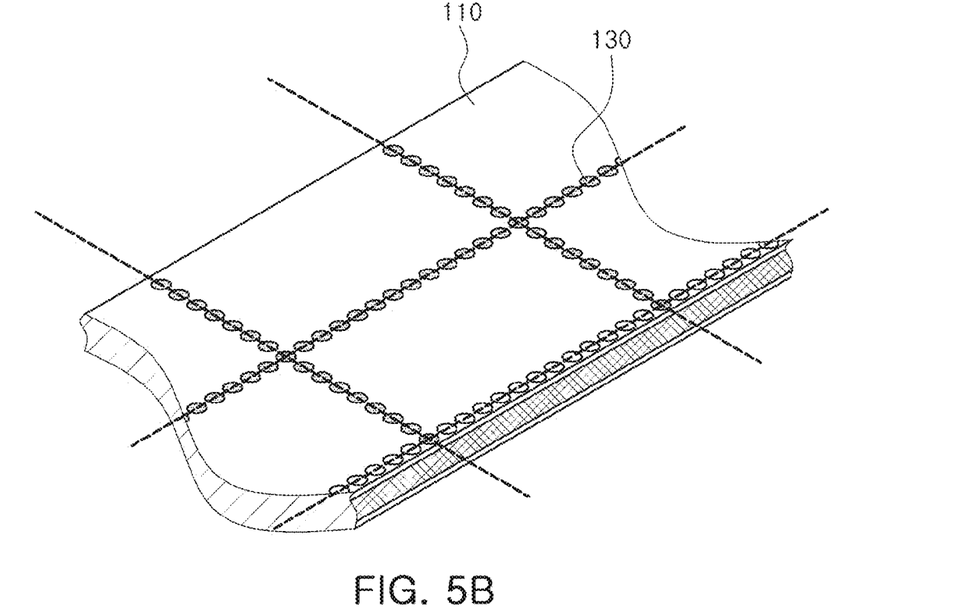
FIG. 5B is a perspective view schematically illustrating an example of a method of manufacturing a printed circuit board.

FIG. 5A illustrates an example of a method of manufacturing a printed circuit board with stitching vias, and FIG. 5B illustrate a perspective view of a base in which stitching vias are formed according to the example of the method of manufacturing a printed circuit board according to FIG. 5A. FIGS. 6 through 11 schematically illustrate shapes of stitching vias that may be formed on a base according to additional examples of methods of manufacturing printed circuit boards.

First, referring to FIG. 5A, an example of a method of manufacturing a printed circuit board includes preparing a base 110 (510), forming a wiring structure on at least one of a surface and an interior of the base 110 (520); forming stitching vias 130 to penetrate through the base 110 (530); and cutting the base along the stitching vias 130 to obtain a printed circuit board (540). The stitching vias 130 may be formed simultaneously with the wiring structures 120, or may be formed before or after the wiring structures 120. Modifications in order of forming the stitching vias 130 and wiring structures 120 will be apparent to those skilled in the art. Likewise, in another example, the cutting of the base 110 may occur before the forming of the wiring structures 120, and the like.

Further, although FIG. 5B does not separately illustrate the wiring structure, it will be apparent to those skilled in the art that the wiring structure may be suitably formed. In 530, a plurality of stitching vias 130 penetrating through the base 110 in a thickness direction and forming an array in at least one direction may be formed. That is, the plurality of stitching vias 130 may be aligned to form a cutting line. Then, the base 110 and the plurality of stitching vias 130 may be cut in the thickness direction, thereby obtaining printed circuit board units in 540.

In this case, the plurality of stitching vias 130 may be arranged while forming a plurality of columns and rows, and the plurality of stitching vias 130 forming the array may be cut simultaneously along cutting lines denoted by dotted lines in FIG. 5B. The stitching vias 130 obtained by this process may be cut in the thickness direction of the base 110 as described in FIG. 1, and cutting surfaces thereof may be co-planar with a side surface of the printed circuit board. However, not all side surfaces of stitching vias 130 need to be co-planar with the side surface of the printed circuit board.

At the time of manufacturing the printed circuit board using the above-mentioned process, stitching vias having various shapes may be obtained depending on a shape, an arrangement form, a cutting method, or the like, of the stitching vias formed in the base 110. First, in an example in which the stitching vias 130 are arranged in a line along one edge of the base 110 as illustrated in FIG. 6, a shape of the stitching vias 130 may be variously changed depending on cutting regions ①, ②, and ③ as illustrated in FIG. 7.

Figure 8:
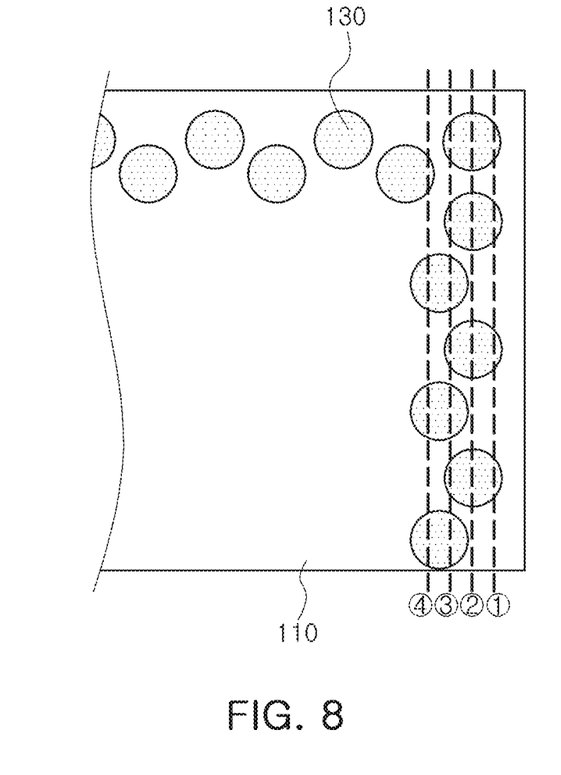
Figure 9:
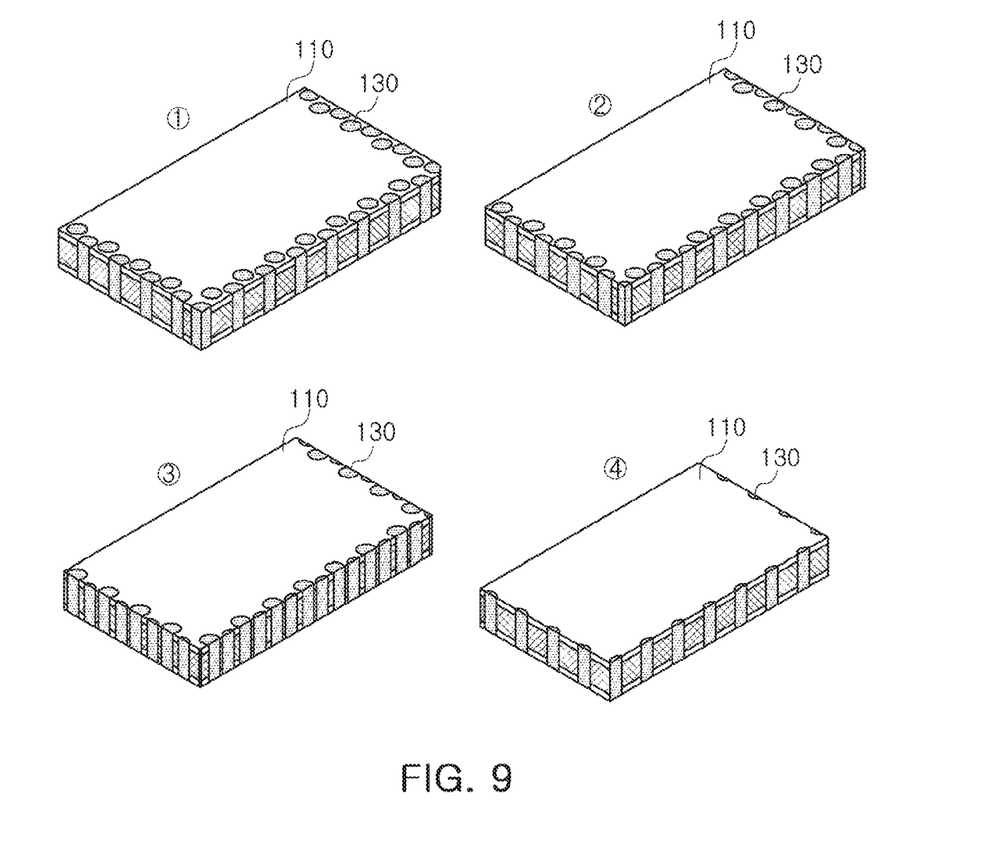
Figure 10:
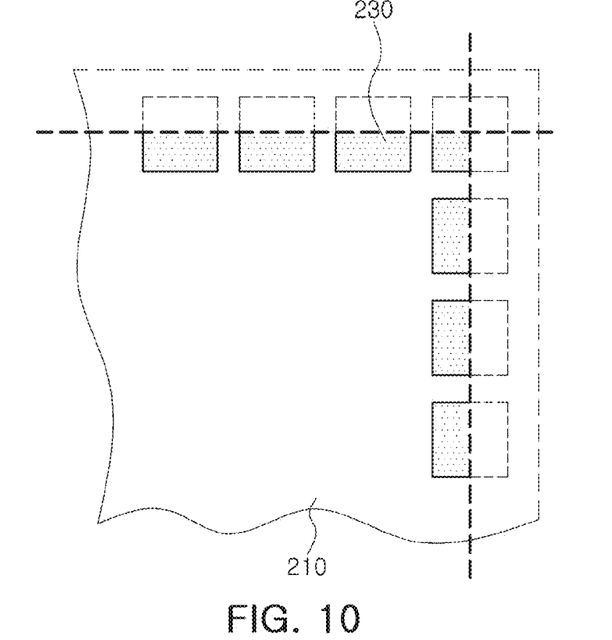
Figure 11:
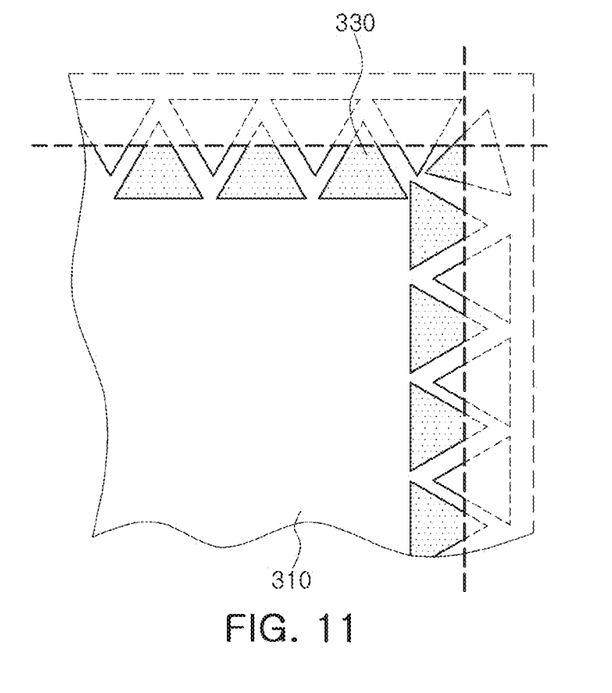

Further, as illustrated in FIG. 8, the stitching vias 130 may be disposed to be shifted left and right based on an arrangement direction of the array along one edge of the base 110. In this example, a shape of the stitching vias 130 found on the obtained printed circuit board may change depending on the cutting regions ①, ②, ③, and ④, as illustrated in FIG. 9. For example, if the cutting region is close to the edge of the base 110 (structures corresponding to ① and ② in FIG. 9), some of the stitching vias 130 may be formed so that side surfaces thereof are not exposed externally. In this case, vias not formed to be exposed externally may be included in the stitching vias 130 or may be referred to as additional vias rather than the stitching vias 130. The additional stitching vias 130 may perform the above-mentioned electromagnetic wave blocking function, heat radiation function, and ground terminal function, or the like. Of course, the vias not exposed externally may also be electrically connected or may not be electrically connected to the wiring structure, such as the ground terminal, as described above with respect to other examples.

Figure 6:
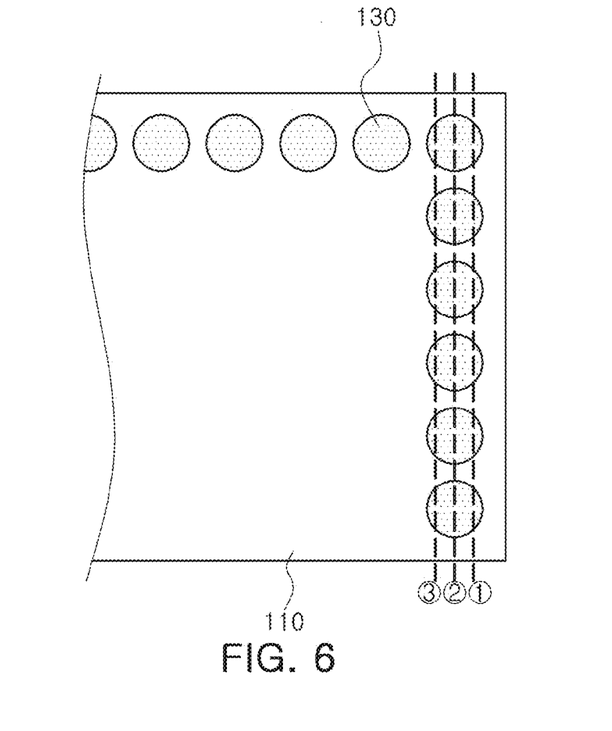
FIGS. 6 through 11 are perspective views and plan views schematically illustrating examples of shapes of a stitching via according to the present description.
Figure 7:
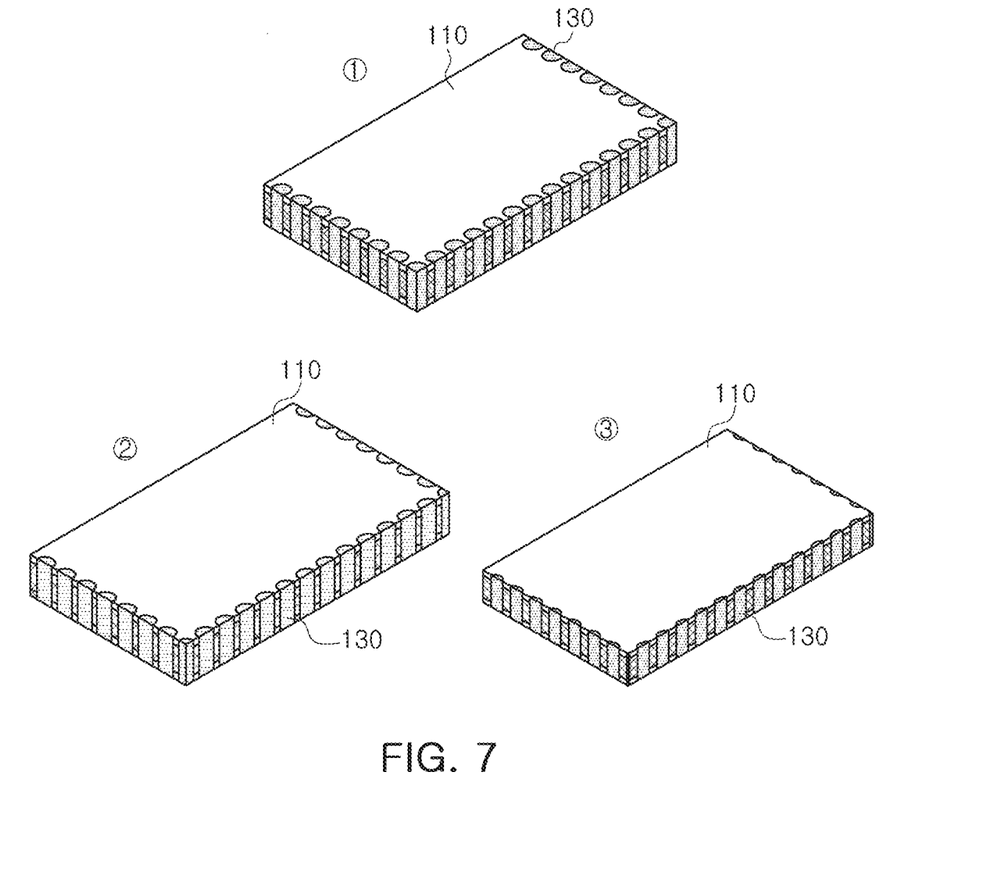

While various examples in which the stitching vias have a circular shape in a plan view before the cutting of the stitching vias are illustrated in FIG. 6, the stitching vias having an entirely cylindrical shape, the shape of stitching vias is not limited thereto. In another example, the stitching via may be formed to have a quadrangular shape (FIG. 10), a triangular shape (FIG. 11) or other geometric shapes, when viewed from above the base. Further, although not explicitly illustrated, at least two of the plurality of stitching vias may be formed to have different shapes from each other. In other words, stitching vias having two or more different shapes may be present in a printed circuit board when viewed from above the base, or the stitching vias are included in a printed circuit board may have different shapes due to the cutting method, the location of the cutting region, and the like. In addition, although not explicitly illustrated, the stitching vias may also be used in a manner in which side surfaces are inclined as well as a cylindrical shape, a triangular pillar shape, a square pillar shape, or the like.

As set forth above, according to various examples of printed circuit boards the electromagnetic wave blocking performance and heat radiation properties of the printed circuit boards may be improved by a plurality of stitching vias exposed on the side surfaces of the boards. In addition, an example of a manufacturing method thereof capable of an efficient production of such a printed circuit board is described.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a wiring structure disposed on at least one of a surface and an interior of a base; and
   stitching vias configured to reduce electromagnetic interference, the stitching vias disposed on a periphery of the base and having exposed side surfaces,
   wherein a center of each of the stitching vias are offset each from the other in a zig-zag manner along one edge of the base.

2. The printed circuit board of claim 1, wherein the stitching vias are formed in alignment along at least one edge of the base.

3. The printed circuit board of claim 2, wherein the stitching vias are formed in alignment along at least two edges of the base.

4. The printed circuit board of claim 3, wherein, one stitching via among the stitching vias is shared between a first set of stitching vias arranged along a first edge of the base and a second set of stitching vias arranged along a second edge of the base adjacent to the first edge.

5. The printed circuit board of claim 2, wherein the stitching vias are formed in alignment along at least four edges of the base.

6. The printed circuit board of claim 1, wherein at least one of the stitching vias is cut in the thickness direction of the base, and a cutting surface thereof is co-planar with a side surface of the printed circuit board.

7. The printed circuit board of claim 1, wherein the stitching vias are electrically connected to a ground terminal of the wiring structure.

8. The printed circuit board of claim 1, wherein the stitching vias are not electrically connected to the wiring structure.

9. The printed circuit board of claim 1, further comprising additional vias disposed around the stitching vias, side surfaces of the additional vias not being exposed externally.

10. The printed circuit board of claim 1, wherein at least two of the stitching vias have different shapes from each other.

11. The printed circuit board of claim 1, wherein regions of the wiring structure disposed on upper and lower surfaces of the base form ground terminals, and a region of the wiring structure disposed in the interior of the base forms a power terminal.

12. The printed circuit board of claim 1, wherein the wiring structure comprises a circuit pattern disposed on at least one of the surface and the interior of the base, and a conductive via connecting the circuit pattern.

13. The printed circuit board of claim 12, wherein diameter of the stitching vias is larger than diameter of the conductive via.

14. The printed circuit board of claim 1, wherein the stitching vias are further configured to radiate heat.

15. A method of manufacturing a printed circuit board, the method comprising:
   forming stitching vias configured to reduce electromagnetic interference, the stitching vias disposed on a periphery of a base in a thickness direction; and
   cutting the base along the stitching vias to obtain a printed circuit board exposing a portion of the stitching vias along a side surface of the printed circuit board,
   wherein a center of each of the stitching vias are offset each from the other in a zig-zag manner along one edge of the base.

16. The method of claim 15, further comprising:
   forming a wiring structure in the base,
   wherein the wiring structure is disposed on a surface or an interior of the base.

17. The method of claim 15, wherein the forming of the stitching vias comprises forming vias to penetrate through the base, and filling the vias with metal.

18. The method of claim 15, wherein the stitching vias are further configured to radiate heat.

* * * * *